US012756401B2

(12) United States Patent
Frappé et al.

(10) Patent No.: US 12,756,401 B2
(45) Date of Patent: Oct. 6, 2026

(54) DEVICE AND METHOD FOR CONTINUOUS-TIME ENERGY CALCULATION OF AN ANALOG SIGNAL

(71) Applicants: CENTRE NATIONAL DE LA RECHERCHE SCIENTIFIQUE, Paris (FR); JUNIA, Lille (FR); UNIVERSITE DE LILLE, Lille (FR); UNIVERSITE POLYTECHNIQUE HAUTS-DE-FRANCE, Valenciennes Cedex (FR); STMICROELECTRONICS (Crolles 2) SAS, Crolles (FR)

(72) Inventors: Antoine Frappé, La Madeleine (FR); Benoît Larras, Lille (FR); Andreia Cathelin, Laval-en-Belledonne (FR); Soufiane Mourrane, Grenoble (FR)

(73) Assignees: JUNIA, Lille (FR); UNIVERSITE DE LILLE, Lille (FR); UNIVERSITE POLYTECHNIQUE HAUTS-DE-FRANCE, Vallenciennes Cedex (FR); STMICROELECTRONICS (Crolles 2) SAS, Crolles (FR)

( * ) Notice: Subject to any disclaimer, the term of this patent is extended or adjusted under 35 U.S.C. 154(b) by 160 days.

(21) Appl. No.: 18/748,787

(22) Filed: Jun. 20, 2024

(65) Prior Publication Data

US 2024/0429934 A1 Dec. 26, 2024

(30) Foreign Application Priority Data

Jun. 21, 2023 (EP) .................................... 23305983

(51) Int. Cl.
*H03M 1/12* (2006.01)
*H03H 17/00* (2006.01)
(Continued)

(52) U.S. Cl.
CPC ............ *H03M 1/125* (2013.01); *H03H 17/06* (2013.01); *H03M 1/0626* (2013.01); *H03M 1/121* (2013.01); *H03H 2017/0081* (2013.01)

(58) Field of Classification Search
CPC ........ H03M 1/06; H03M 1/12; H03M 1/0626; H03M 1/125; H03M 1/121; H03M 17/00; H03M 17/06; H03M 17/2017
See application file for complete search history.

(56) References Cited

U.S. PATENT DOCUMENTS

| | | | | |
|---|---|---|---|---|
| 6,466,143 B2 * | 10/2002 | Eshraghi | H03M 3/372 | 341/143 |
| 7,348,914 B1 * | 3/2008 | Hazanchuk | H03M 1/124 | 341/110 |

(Continued)

OTHER PUBLICATIONS

Mourrane Soufiane et al: "Event-Driven Continuous-Time Feature Extraction for Ultra Low-Power Audio Keyword Spotting", 2021 IEEE 3rd International Conference on Artificial Intelligence Circuits and Systems (AICAS), IEEE, Jun. 6, 2021 (Jun. 6, 2021), pp. 1-4.

(Continued)

*Primary Examiner* — Lam T Mai
(74) *Attorney, Agent, or Firm* — HAUPTMAN HAM, LLP

(57) ABSTRACT

A device for continuous-time energy calculation of an analog signal includes a continuous-time analog-to-digital converter configured to convert the analog signal into a request signal and a direction signal; at least one filtering unit configured to output a filtered output signal, and including a delaying module and a calculating module, connected to the delaying module and configured to calculate the filtered output signal. The device further includes at least one pulse combiner connected to the delaying module and configured to output a combined request signal; and at least one energy
(Continued)

estimator connected to the filtering unit and to the pulse combiner, and configured to compute a stored energy value associated with each pulse of the combined request signal.

10 Claims, 6 Drawing Sheets

(51) Int. Cl.
*H03H 17/06* (2006.01)
*H03M 1/06* (2006.01)

(56) References Cited

U.S. PATENT DOCUMENTS

| | | | | |
|---|---|---|---|---|
| 8,878,711 | B1 * | 11/2014 | Loeda Pagliano | H03M 3/37 341/118 |
| 9,304,154 | B1 * | 4/2016 | Droz | G01R 19/04 |
| 9,397,693 | B1 * | 7/2016 | Jain | H03M 1/125 |
| 10,218,369 | B2 * | 2/2019 | Patil | H03M 1/002 |
| 2002/0140590 | A1 * | 10/2002 | Eshraghi | H03M 3/372 341/143 |
| 2008/0147761 | A1 * | 6/2008 | Melanson | H03H 17/0455 708/313 |
| 2009/0326692 | A1 * | 12/2009 | Lin | H03M 1/1215 341/144 |
| 2011/0102220 | A1 * | 5/2011 | Nam | H03M 1/0836 341/122 |
| 2015/0042501 | A1 * | 2/2015 | Shibata | H03M 1/1245 341/161 |
| 2018/0054209 | A1 * | 2/2018 | Kris | H03M 1/60 |
| 2021/0257908 | A1 | 8/2021 | Gonzalez Santos et al. | |

OTHER PUBLICATIONS

Wu Tzu-Fan et al: “A Flash-Based Non-Uniform Sampling ADC With Hybrid Quantization Enabling Digital Anti-Aliasing Filter”, IEEE Journal of Solid-State Circuits, IEEE, USA, vol. 52, No. 9, Jul. 27, 2017 (Jul. 27, 2017), pp. 2335-2349.

Mourrane Soufiane et al: “Low-Power Event-Driven Spectrogram Extractor for Multiple Keyword Spotting: A proof of concept”, 2023 21st IEEE Interregional Newcas Conference (NEWCAS), IEEE, Jun. 26, 2023 (Jun. 26, 2023), pp. 1-5.

Extended European Search Report issued in corresponding European Application No. 23305983.1, mailed Dec. 20, 2023, European Patent Office, Munich, Germany, pp. 1-7.

* cited by examiner

DEVICE AND METHOD FOR CONTINUOUS-TIME ENERGY CALCULATION OF AN ANALOG SIGNAL

DOMAIN OF THE INVENTION

The present invention concerns a device for continuous-time energy calculation of an analog signal.

The invention also concerns an associated method for continuous-time energy calculation of an analog signal.

TECHNOLOGICAL BACKGROUND

To calculate the energy from an analog signal, it is well known to perform discrete-time digital signal processing. In this case, a clock is used to sample the analog signal, and to synchronize subsequent processing operations. In this case, the power consumed for the discrete-time digital signal processing is constant in time, and depends on the frequency of the clock: the higher the frequency, the greater the power consumed.

This leads to high power consumption, which is wasteful in particular in settings where the analog signal is sparse. This is the case for example in voice signal processing, where a voice signal can alternate with long periods of silence or of non-significant noise. Voice signal processing is particularly relevant in keyword spotting applications, where the recognition of one keyword will result in an action being performed by a system, with applications in connected objects and real-time sensing.

To decrease power consumption, it is known to perform continuous-time digital signal processing, and in particular, continuous-time non-uniform amplitude sampling of the analog signal. However, this leads to the absence of a time reference, making it impossible to calculate an energy value from the analog signal.

The present invention aims to solve this problem, by calculating the energy of the analog signal while reducing the power consumption.

SUMMARY

To this end, the invention consists in a device, for continuous-time energy calculation of an analog signal, comprising:

- a continuous-time analog-to-digital converter, configured to convert the analog signal into a request signal, the request signal comprising at least one pulse, each pulse being representative of the analog signal crossing one of a plurality of predetermined levels, and a direction signal, associated to the request signal, the direction signal being representative of a direction of the level crossing;
- at least one filtering unit, configured to perform a continuous-time finite impulse response filtering operation, the at least one filtering unit being configured to receive the request signal, the direction signal, and to output a filtered output signal, the at least one filtering unit comprising:
  - a delaying module, configured to receive the request signal and the direction signal, and to output at least one delayed request signal, delayed from the request signal by a delay time, and at least one delayed direction signal, delayed from the direction signal by the delay time, the at least one delayed request signal being associated with one of the at least one delayed direction signal; and
  - a calculating module, connected to the delaying module the calculating unit being configured to receive the request signal, the direction signal, the at least one delayed request signal and the at least one delayed direction signal and to calculate the filtered output signal.

According to the invention, the device further comprises:

- at least one pulse combiner, connected to the delaying module, the at least one pulse combiner being configured to receive the request signal and the at least one delayed request signal and to output a combined request signal; and
- at least one energy estimator, connected to the filtering unit and to the pulse combiner, the at least one energy estimator being configured to receive the filtered output signal and the combined request signal and configured to compute a stored energy value associated with each pulse of the combined request signal.

Advantageously, the combined request signal acts as a non-uniformly distributed time base, which is then used to track the variations in the filtered output. More specifically, it can be used as a time base to calculate the energy value associated with the filtered output. Thus, the energy present in the analog signal is calculated using continuous-time processing, which enables the decrease of the power consumption.

According to certain embodiments of the invention, the device comprises one or several of the following characteristics, separately, or according to any technically possible combinations:

- The combined request signal is a result of a concatenation of the request signal and the at least one delayed request signal.
- The delaying module comprises a plurality of successive delay blocks, each delay block applying said delay time, a delayed request signal and a delayed direction signal being obtained as an output of each delay block.
- The at least one calculating module comprises a plurality of multiply-accumulate blocks, each multiply-accumulate block receiving one of the plurality of delayed request signals and the delayed direction signal associated to the delayed request signal, or the request signal and direction signal.
  - Each multiply-accumulate block is associated with a coefficient.
  - The at least one pulse combiner is configured to receive all or only some of the plurality of delayed request and associated direction signals.
  - The at least one energy estimator comprises:
- a combinatory squarer configured to output a squared filtered output signal at each rising edge of the combined request signal;
- an accumulator, configured to add the squared filtered output signal to a stored energy value to obtain an updated energy value and to set a value of the stored energy value to the updated energy value at each rising edge of the combined request signal, and the accumulator is further configured to receive a frame signal, comprising alternating high states and low states, and the frame signal goes from a high state to a low state, to output the stored energy value and then set the stored energy value to zero.
- The device comprises a plurality of energy estimators, each energy estimator being configured to receive a different frame signal.
- The delaying module and/or the at least one calculating module and/or the at least one pulse combiner and/or the at least one energy estimator is implemented on an integrated circuit comprising at least one fully depleted silicon on insulator transistor.

The invention also relates to a method for continuous-time energy calculation of an analog signal, the method being implemented by a device according of any of the preceding claims, the method comprising:

converting the analog signal into the request signal, the request signal comprising at least one pulse, each pulse being representative of the analog signal crossing one of the plurality of predetermined levels, and into the direction signal, associated to the request signal, the direction signal being representative of the direction of the level crossing;

filtering the request signal and the direction signal by a finite impulse response filtering operation the filtering comprising:

delaying the request signal and the associated direction signal to output the at least one delayed request signal, delayed from the request signal by the delay time, and the delayed direction signal associated to the at least one delayed request signal, delayed from the direction signal by the delay time;

calculating from the request signal, the direction signal, the at least one delayed request signal and the at least one delayed direction signal the filtered output signal;

combining the request signal and the at least one delayed request signal into the combined request signal acting as a non-uniform time base; and computing the stored energy value associated with each pulse of the combined request signal from the filtered output signal.

BRIEF INTRODUCTION OF THE DRAWINGS

The features and advantages of the invention will appear upon reading the following description, given only as an example and not limited to the following description, and making reference to the enclosed drawings, wherein.

DETAILED DESCRIPTION

Figure 1:
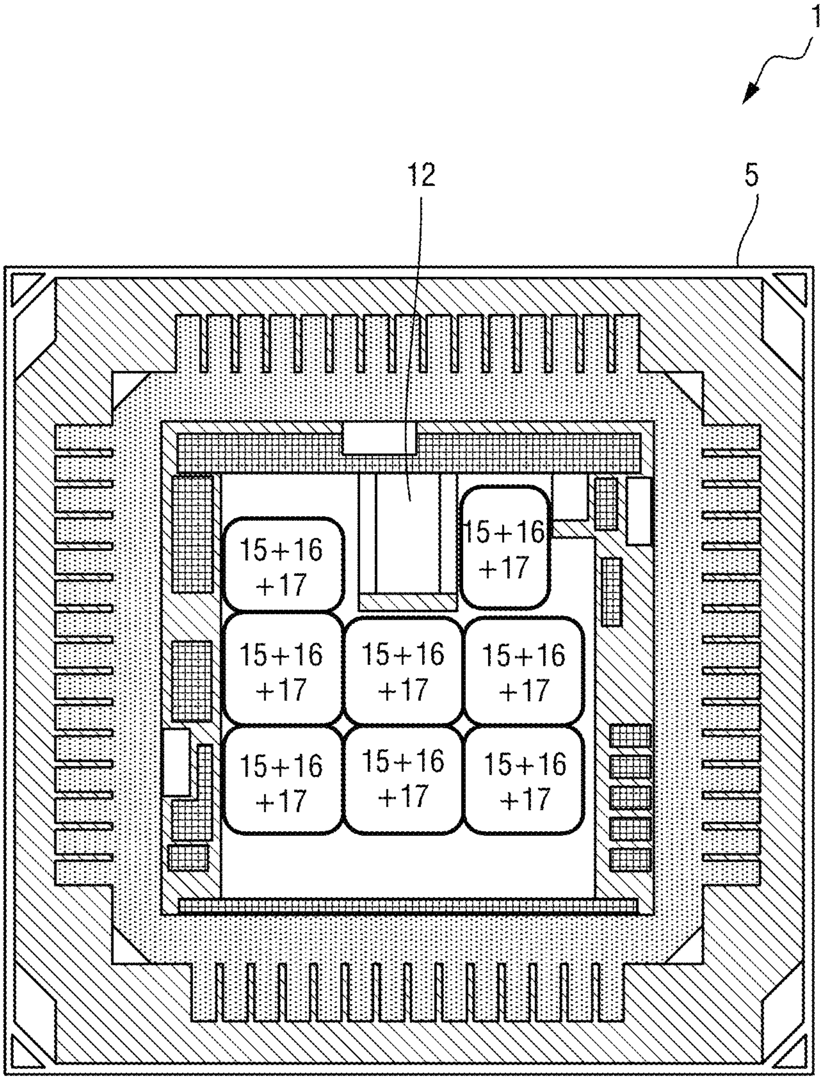
FIG. 1 is a top view of an integrated circuit according to an embodiment of the invention.

FIG. 1 is a view of an integrated device 1 according to an embodiment of the invention. The device 1 comprises a continuous-time analog-to-digital converter 10, or CT-ADC 10, not visible on FIG. 1 but visible on FIG. 2, and an integrated circuit 5.

Figure 2:
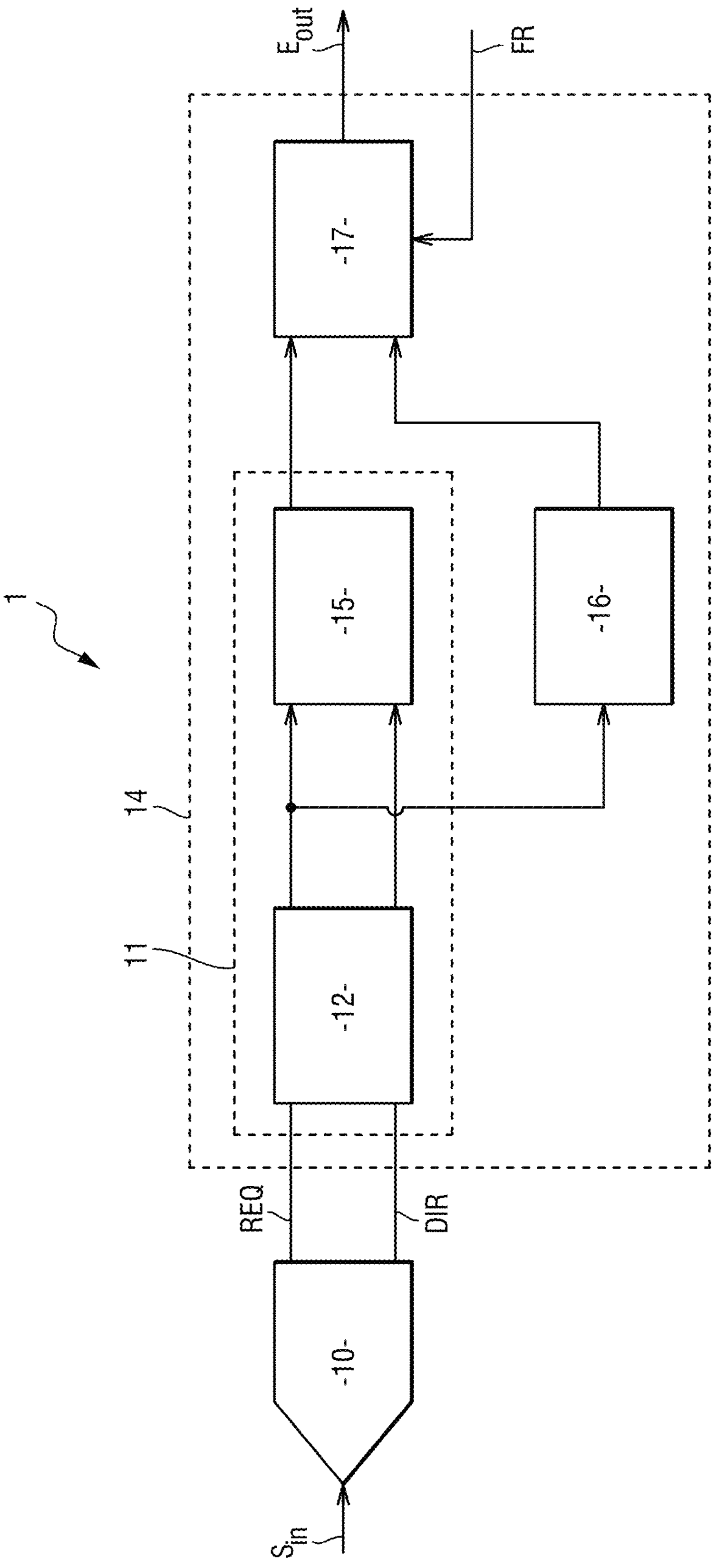
FIG. 2 is a schematic of the device of FIG. 1.

When the device 1 is in operation, the continuous-time analog-to-digital converter 10 converts an analog signal $S_{in}$ into a request signal REQ and a direction signal DIR, visible on FIG. 2. In other words, the CT-ADC 10 receives the analog signal $S_{in}$, which is preferentially an analog signal with a frequency equal to or below 1 MHZ, and outputs the request signal REQ and the direction signal DIR. The analog signal $S_{in}$ is for example an audio signal, in particular a voice signal, and the device 1 is used for voice signal processing.

The CT-ADC 10 is characterized by a given resolution, which determines a number of a plurality of predetermined levels of the CT-ADC 10. The CT-ADC 10 samples the analog signal $S_{in}$ only if the analog signal $S_{in}$ crosses one of the plurality of predetermined levels. The predetermined levels are predetermined quantization amplitude levels of the analog signal $S_{in}$ and depend on the resolution of the CT-ADC 10. The samples generated by the CT-ADC 10 form a request signal REQ and a direction signal DIR, associated to the request signal REQ. The request signal REQ comprises at least one pulse and the direction signal DIR comprises at least one state. In general, the request signal REQ comprises a plurality of pulses and the direction signal DIR comprises a plurality of states, each state being associated to a corresponding pulse. Each pulse of the request signal REQ corresponds to the analog signal $S_{in}$ crossing one of the predetermined level and comprises a rising edge. Each state on the direction signal DIR is either high state, corresponding to an increase in the amplitude level of the analog signal $S_{in}$, or low, corresponding to a decrease in the amplitude level of the analog signal $S_{in}$. In other terms, the CT-ADC 10 encodes asynchronously the analog signal $S_{in}$, the predetermined levels being the corresponding quantization levels.

As the CT-ADC 10 samples the analog signal $S_{in}$ only based on the amplitude of the analog signal $S_{in}$ and not based on a sampling frequency, the time between two successive rising edges in the request signal REQ is unknown and may vary.

The integrated circuit 5 is connected to the CT-ADC 10 and comprises at least one digital processing module 14, visible on FIG. 2. Each digital processing module 14 comprises a filtering unit 11, a pulse combiner 16 and an energy estimator 17. The filtering unit 11 is configured to perform continuous-time finite impulse response filtering operations. The filtering unit 11 comprises a delaying module 12 and a calculating module 15.

Figure 3:
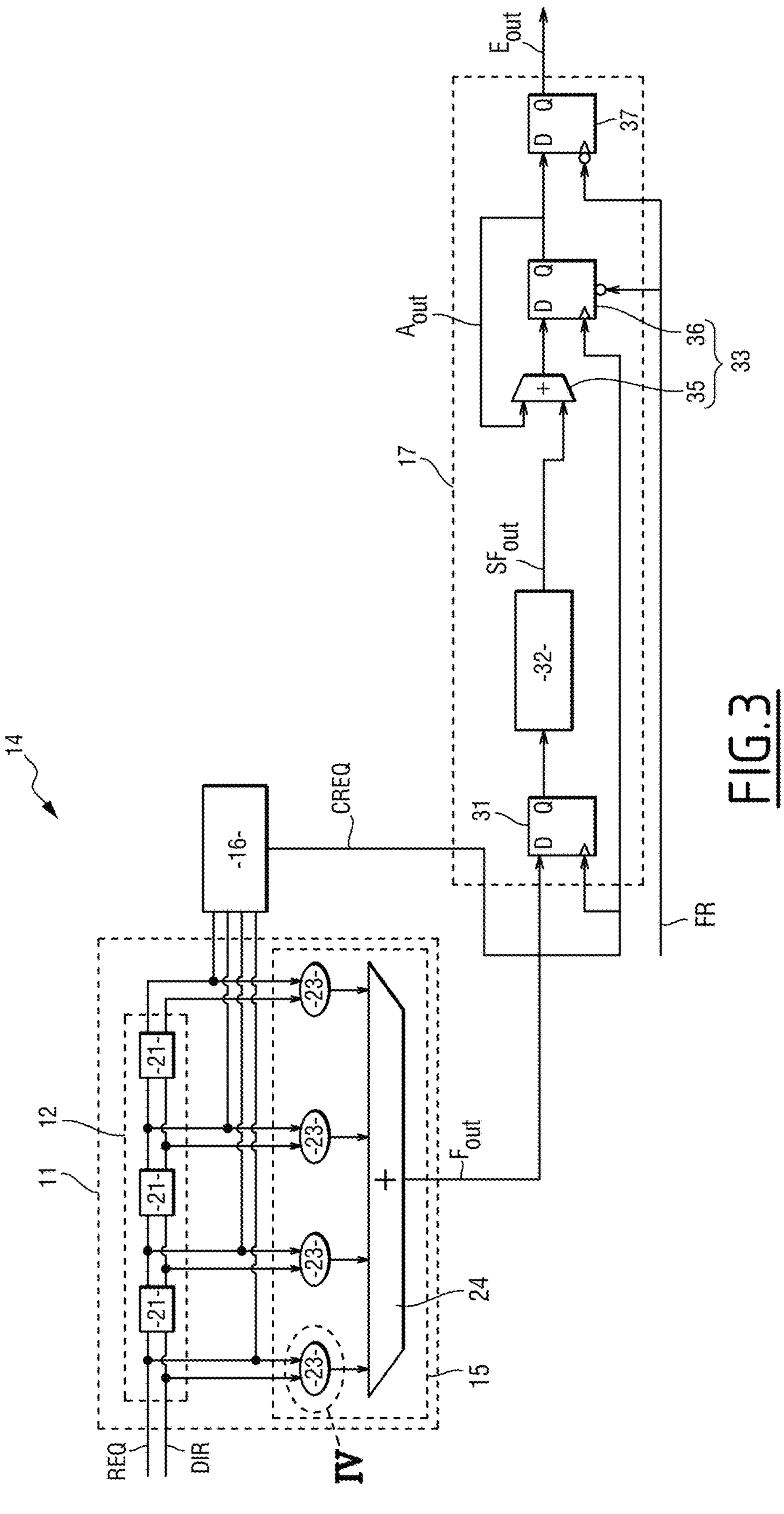
FIG. 3 is a detailed schematic of the device.
Figure 4:
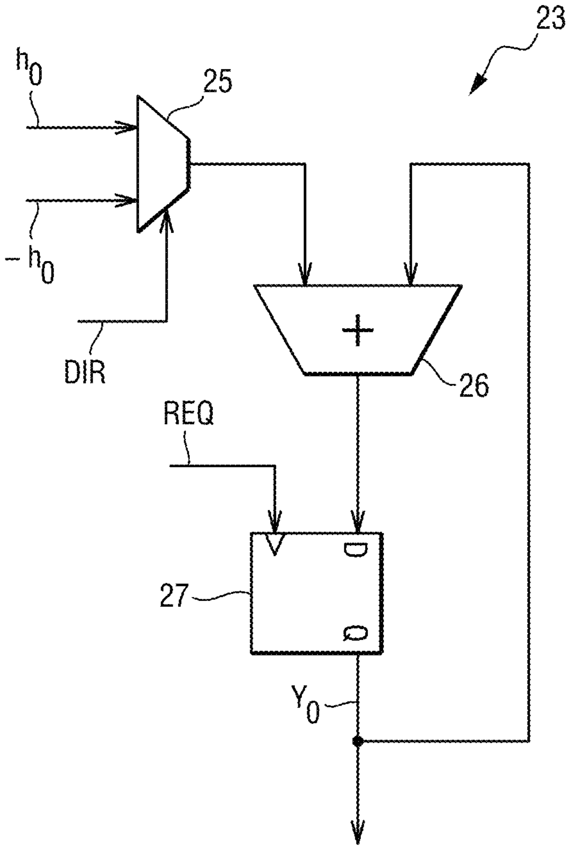
FIG. 4 is a schematic of detail IV of FIG. 3.

In FIGS. 2 to 4, only one digital processing module 14 is represented and does not share the delaying module 12 with other digital processing modules 14. As an alternative, the device 1 comprises eight digital processing modules 14 for voice processing applications, but could comprise more or less, for example between one to sixteen digital processing modules 14, and up to thirty-two or sixty-four digital processing modules 14. The digital processing modules 14 may share components between themselves, such as the delaying module 12, as visible on FIG. 1, where one delaying module 12 is shared by all digital processing modules 14. Alternatively, all digital processing modules 14 may be fully separated and do not share any components. Advantageously, the integrated circuit 5 comprises at least one fully depleted silicon on insulator transistor, in particular at least one 28 nm fully depleted silicon on insulator transistor, which is used to implement on-chip the 30 digital processing modules 14.

The delaying module 12 is connected to the CT-ADC 10. When the device 1 is in operation, the delaying module 12 is configured to receive the request and direction signals REQ and DIR output by the CT-ADC 10. The delaying module 12 comprises at least one delay block 21, and advantageously comprises a plurality of successive delay blocks 21, as shown in FIG. 3.

FIG. 3 shows three delay blocks 21 as an example, but the delaying module 12 alternatively comprises more or less delay blocks 21, for example between one and twenty delay blocks 21, for example sixteen delay blocks 21. Each delay block 21 delays signals it receives by a given delay time.

This given delay time is advantageously configurable by external means. In the example of the figures, each delay block 21 is identical, and delays the signals it receives by the same delay time. The delay time is for example set between 10 and 100 μs, for example is equal to 62.5 μs when performing voice signal processing.

The delay blocks 21 are arranged sequentially, so that when the device 1 is in operation, an output signal of a first delay block 21 is received by a second delay block 21. Therefore, a signal passing through the delay blocks 21 is delayed by an integer multiple of the delay time, the integer multiple being equal to the number of delay blocks 21 the signal went through.

In the examples of FIGS. 2 to 4, the request signal REQ and the direction signal DIR are received by the delay blocks 21. A first delay block 21 thus outputs a delayed request signal and a delayed direction signal, both delayed request and direction signals being delayed by the delay time. Thus, the delayed direction signal maintains its association with the delayed request signal. The delayed request and direction signals are then received by a following delay block 21, which outputs further delayed request and direction signals. The delaying module 12 outputs the request signal REQ and the direction signal DIR and the delayed request and direction signals delayed by the three delay blocks 21.

In a variant, not represented, the delay blocks may not have the same behaviour and delay the signal by a different delay time. In this case, a signal passing through the delay blocks is delayed by the sum of all the delay times of the delay blocks it passes through.

The calculating module 15 is connected to the delaying module 12. The calculating module 15 comprises at least one multiply-accumulate block 23 and a summation unit 24. Advantageously, the calculating module 15 comprises one more multiply-accumulate blocks 23 than there are delay blocks 21 in the delaying module 12. In the example shown on FIG. 3, the calculating module 15 comprises four multiply-accumulate blocks 23, and the delaying module 12 comprises three delay blocks 21.

A first multiply-accumulate block 23 is connected to the delaying module 12 and receives the request and direction signals REQ and DIR, and the other multiply-accumulate blocks 23 are each connected to one of the delay blocks 21 of the delaying module 12 and receive the delayed direction and request signals from each delay block 21.

A detailed schematic of a structure of the first multiply-accumulate block 23 is shown on FIG. 4.

In the example of the figures, each multiply-accumulate block 23 has an identical structure. Each multiply-accumulate block 23 comprises a logic multiplexer 25, a summation unit 26 and a D flip-flop 27. The summation unit 26 is connected on one input to an output of the logic multiplexer 25 and on another input to an output port of the D flip-flop 27. The summation unit 26 is connected on an output to a data input port of the D flip-flop 27.

Each multiply-accumulate block 23 is associated with a coefficient $h_i$, with i an integer ranging from 0 to k−1, k being the number of multiply-accumulate blocks 23. In other terms, k is also called a length of the filtering unit 11, and k−1 the order of the filter 11.

In the example shown in FIG. 3, k is equal to four, but may be more or less, generally between one and thirty-two. The coefficients $h_i$ are advantageously stored in a memory, not represented, and are received respectively by the logic multiplexers 25 of each multiply-accumulate block 23. The coefficients $h_i$ are advantageously configured, for example by a user of the device 1, according to the analog signal $S_{in}$, and desired characteristics of the filtering unit 11.

For example, in the case of voice signal processing, the coefficients $h_i$ are chosen so that one of the filtering units 11 is a band pass filter with a bandwidth comprised between 573.8 Hz and 1079.5 Hz with an out-of-band attenuation of 5 dB.

The following description refers to the first multiply-accumulate block 23, connected to the CT-ADC 10 and configured to receive the request and direction signals REQ and DIR. It is applicable to all the other multiply-accumulate blocks 23 by changing the request and direction signals REQ and DIR into the delayed request and direction signals.

When the device 1 is in operation, the logic multiplexer 25 of the first multiply-accumulate block 23 receives the value of the coefficient $h_0$ it is associated with, and the direction signal DIR. The logic multiplexer 25 then outputs either the value of the coefficient $h_0$, or its opposite $-h_0$, based on a value of the direction signal DIR. For example, if the direction signal DIR is in high state, the logic multiplexer 25 outputs the value $h_0$. If the direction signal DIR is in low state, the logic multiplexer 25 outputs the value $-h_0$. As an alternative, the logic multiplexer 25 outputs the value $h_0$ if the direction signal DIR is in low state and the logic multiplexer 25 outputs the value $-h_0$ if the direction signal DIR is in high state. This value is then added by the summation unit 26 with an output value of the D flip-flop 27 to obtain a summation value, which is received by the D flip-flop 27. The D flip-flop 27 also receives the request signal REQ, and when a rising edge in the request signal REQ occurs, the D flip-flop 27 is triggered and outputs an output value $Y_0$ of the first multiply-accumulate block 23, which is equal to the summation value.

In other words, the output value $Y_0$ of the first multiply-accumulate block 23 is determined by the following equation:

$$Y_0(t_n) = \begin{cases} Y_0(t_{n-1}) + h_0, & \text{if } REQ = 1 \text{ and } DIR = 1 \\ Y_0(t_{n-1}) - h_0, & \text{if } REQ = 1 \text{ and } DIR = 0 \end{cases}$$

$t_{n-1}$, $t_n$ are successive times corresponding to a rising edge in the request signal REQ. As the rising edges are not uniform, the successive times $t_{n-1}$, and $t_n$ are not separated by a regular interval.

Initially, the output value $Y_0$ is equal to zero. The output value $Y_0$ is the quantization value associated to the request signal REQ, multiplied by coefficient $h_0$.

A filtered output signal $F_{out}$ from the calculating module 15 is then obtained by summing the output values of all the multiply-accumulate blocks 23, which is performed by the summation unit 24. The filtered output signal $F_{out}$ is therefore a result of the finite impulse response filtering operation performed by the filter 11 on the request signal REQ and the direction signal DIR. The filtered output signal $F_{out}$ varies when the output value of each multiply-accumulate block 23 varies.

The pulse combiner 16 is connected to the CT-ADC 10 and to all the REQ outputs of all the delay blocks 21, as presented in FIG. 3. When the device 1 is in operation, the pulse combiner 16 receives the request signal REQ and the delayed request signals that are output by the delay blocks 21. The pulse combiner 16 then outputs a combined request signal CREQ. The combined request signal CREQ is advantageously a concatenation of the request signal REQ and the delayed request signals received by the pulse combiner 16.

The concatenation is advantageously performed by a logical "OR" operation. Optionally, the pulse combiner 16 further comprises a synchronizing block, not represented, to take into account propagation delays caused by the multiply-accumulate blocks 23 and the summation unit 24, for example by adding a programmable delay, so that the combined request signal CREQ and the filtered output signal $F_{out}$ are synchronized. The combined request signal CREQ advantageously forms a non-uniformly distributed time base suitable to track variations of the filtered output signal $F_{out}$.

The energy estimator 17 is connected to the filtering unit 11 and to the pulse combiner 16. The energy estimator 17 advantageously comprises a D flip-flop 31, a combinatory squarer 32 and an accumulator 33, visible on FIG. 3.

The D flip-flop 31 is connected to the combinatory squarer 32.

When the device 1 is in operation, the D flip-flop 31 receives the filtered output signal $F_{out}$ and the combined pulse signal CREQ. For each rising edge of the combined pulse signal CREQ, the D flip-flop 31 is triggered and outputs a corresponding filtered output signal value, which is then received by the combinatory squarer 32. The combinatory squarer 32 calculates and outputs a squared filtered output signal $SF_{out}$, which is the square value of the filtered output signal $F_{out}$.

In a variant, the squared filtered output signal $SF_{out}$ is an approximation of the square value of the filtered output signal $F_{out}$.

The accumulator 33 is connected to the combinatory squarer 32. The accumulator 33 comprises a summation unit 35 and a resettable D flip-flop 36. The summation unit 35 is connected in input to the combinatory squarer 32 and to the Q output port of the resettable D flip-flop 36. The resettable D flip-flop 36 is further connected to an output port of the summation unit 35 and to the pulse combiner 16. A D flip-flop 37 is connected to the resettable D flip-flop 36.

When the device 1 is in operation, the squared filtered output signal $SF_{out}$ is received by the summation unit 35. The summation unit 35 adds the squared filtered output signal $SF_{out}$ to a stored energy value $A_{out}$ in the resettable D flip-flop 36 to obtain an updated energy value. The stored energy value $A_{out}$ is then modified to the updated energy value at each rising edge in the combined request signal CREQ. More precisely, the resettable flip-flop 36 outputs the updated energy value at each rising edge in the combined request signal CREQ, so that the stored energy value $A_{out}$ is modified to the updated energy value.

The combined request signal CREQ acts as a time-base for energy calculation, as it is used to determine when to modify the stored energy value $A_{out}$.

When the device 1 is in operation, the resettable D flip-flop 36 further receives a frame signal FR. The frame signal FR comprises at least one alternating low and high state. In general, the frame signal FR comprises multiple low states alternating with multiple high states. The low and high states are advantageously regular, such that the frame signal FR is periodic. In variant, the frame signal FR is not periodic.

When the frame signal FR goes from a high state to a low state, also called a falling edge, the resettable D flip-flop 36 is reset and the D flip-flop 37 is activated. The D flip-flop 37 outputs an energy value $E_{out}$ equal to the stored energy value $A_{out}$, and the stored energy value $A_{out}$ is set to zero. The stored energy value $A_{out}$ stays equal to zero until the frame signal FR goes from a low state to a high state, also called rising edge, at which time the stored energy value $A_{out}$ is modified again at each rising edge in the combined request signal CREQ, as previously described.

As an alternative, the resettable D flip-flop 36 is reset and the D flip-flop 37 is activated when a rising edge occurs in the frame signal FR, and the stored energy value $A_{out}$ stays equal to zero until a falling edge occurs in the frame signal FR.

The energy value $E_{out}$ corresponds to an approximation of an energy of the analog signal $S_{in}$ in a frequency range corresponding to the bandwidth of the filtering unit 11, calculated over a high state of the frame signal FR. As the rising edges comprised in the combined request signal CREQ are not distributed uniformly and the time between two successive rising edges in the combined request signal CREQ may vary, the energy value $E_{out}$ is calculated without ponderation of the time between successive rising edges in the combined request signal CREQ. In other words, even though the time between two rising edges in the combined request signal CREQ may vary, when calculating the energy value $E_{out}$, it is considered that all the rising edges in the combined request signal CREQ are evenly distributed. Thus, the energy value $E_{out}$ is not exactly equal to the energy of the analog signal $S_{in}$. A discrepancy between the energy value $E_{out}$ and an energy value output by a similar device through discrete time digital signal processing is low, advantageously of less than 1% on average in a voice signal processing application.

The energy value $E_{out}$ is advantageously used to display a spectrogram for a frequency interval corresponding to the bandwidth of the filtering unit 11, by collecting energy values $E_{out}$ over multiple time frames.

Alternatively, for voice signal processing applications such as keyword spotting, the estimated energy values $E_{out}$ are used as features extracted from the voice signal. The energy values are advantageously stored in a dedicated memory unit, where additional processing, such as leading one detection and truncation of the energy values $E_{out}$ can be performed. The truncated energy values are advantageously used as input to a neural network trained to detect predetermined keywords.

Figure 5:
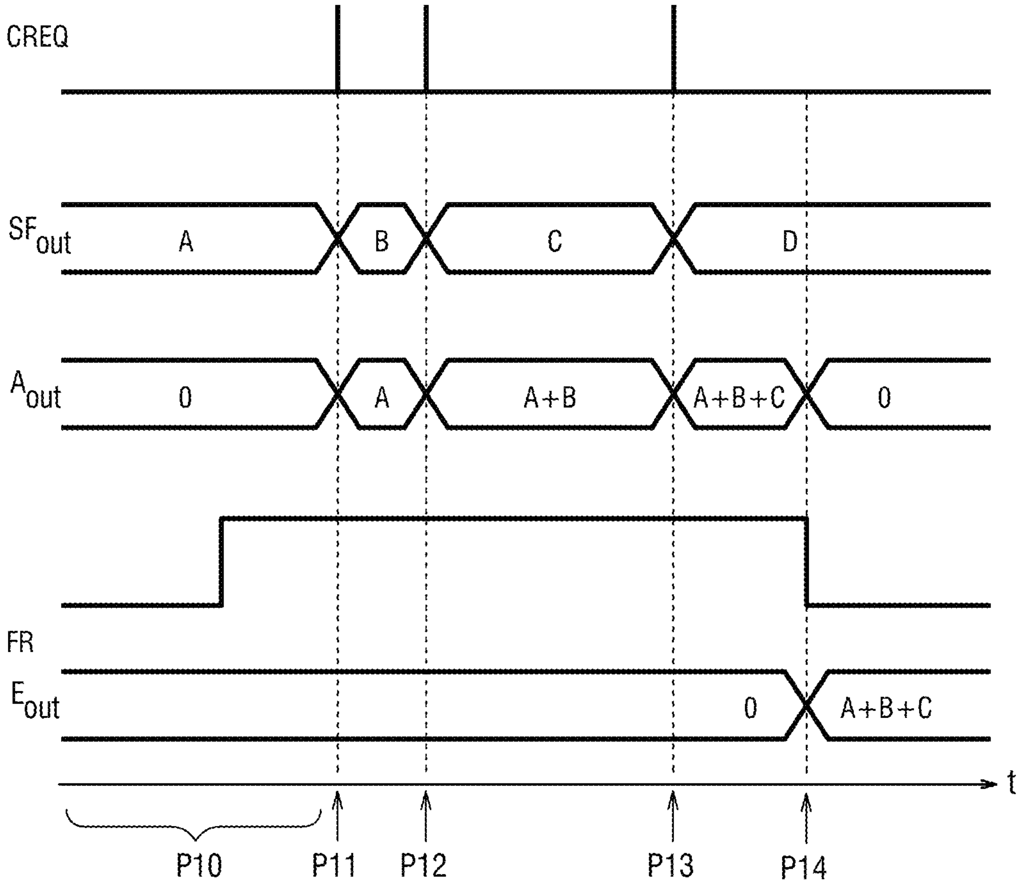
FIG. 5 is a graph showing states of the device during its operation as a function of time.

FIG. 5 represents an example of an evolution of signals received and output by the accumulator 33 when the device 1 is in operation.

During phase P10, before a rising edge occurs in the combined request signal CREQ, the squared filtered output signal $SF_{out}$ is constant, equal to value A, the stored energy value $A_{out}$ is equal to zero, and the energy value $E_{out}$ is equal to zero. A rising edge occurs in the frame signal FR, with no impact on the values previously mentioned.

At each phase P11, P12 and P13, which each correspond to a rising edge at the combined request signal CREQ, the squared filtered output signal $SF_{out}$ changes, as a rising edge in the combined request signal CREQ is synchronized with a change in the filtered output signal $F_{out}$. The stored energy $A_{out}$ changes as well, and becomes the updated energy value, which is a sum of the stored energy value $A_{out}$ and the value of the squared filtered output signal $SF_{out}$ before each rising edge occurred. In the example of FIG. 5, after phase P11, the squared filtered output signal $SF_{out}$ becomes equal to value B and the stored energy value $A_{out}$ becomes equal to value A. Similarly, after phases P12 and P13, but before phase P14, the squared filtered output signal $SF_{out}$ successively becomes equal to values C and D and $A_{out}$ successively becomes equal to value A+B and A+B+C. The energy value $E_{out}$ stays constant, equal to zero, or to the previous energy value $E_{out}$.

At phase P14, a falling edge occurs on the frame signal FR. This causes the energy value $E_{out}$ to become equal to the stored energy value $A_{out}$, and the stored energy value $A_{out}$ to be reset to zero. Thus, a high state in the frame signal FR corresponds to a time duration over which the energy value $E_{out}$ is calculated. The value of the squared filtered signal $SF_{out}$ is not modified.

The combined request signal CREQ is used as an unevenly distributed time base in order to synchronise the operation of the filtering unit 11 with the combinatory squarer 32 and the accumulator 33. More precisely, the combined request signal CREQ is used to follow every variation of the filtered output signal $F_{out}$, so that the energy value $E_{out}$ is a function of all the variations of the filtered output signal $F_{out}$.

The operation of the device 1 requires little power due to the device 1 performing continuous-time processing. Indeed, in this case the device 1 consumes power only if the analog signal $S_{in}$ reaches predetermined levels. In case of silence, or low background noise, the CT-ADC 10 does not sample the analog signal $S_{in}$, resulting in reduced power consumption. A power consumption of the microchip 5 of the device 1 is for example in a voice signal processing application, lower than 1 μW, preferentially lower than 500 nW. In particular, a power consumption of the energy estimator 17 is lower than 5 nW, preferentially lower than 2 nW when detecting keywords in audio signals. The values may vary, depending on the application and the type of signal.

In a variant not represented, the pulse combiner is not connected to all the delay blocks. In this case, the pulse combiner does not take into account the delayed request signals output by the delay blocks which are not connected to the pulse combiner. This results in the variations in the filtered output caused by a delay block not connected to the pulse combiner being ignored when calculating the energy values. As an alternative, some delay blocks are deactivated, and do not transmit delayed request signals to the pulse combiner. Both cases allow to obtain an effect similar to modifying the order of the filtering unit without changing an architecture of the filtering unit. Advantageously, the user determines if the pulse combiner is connected to all the delay blocks or not, and if not, to which delay blocks the pulse combiner is connected, or which delay blocks are deactivated.

In a variant not represented, each digital processing module comprises more than one energy estimator, for example three energy estimators. When the device is in operation, the energy estimators of the same digital processing module advantageously receive a different frame signal. The frame signals advantageously overlap. The energy value can thus be calculated over different overlapping time durations.

Figure 6:
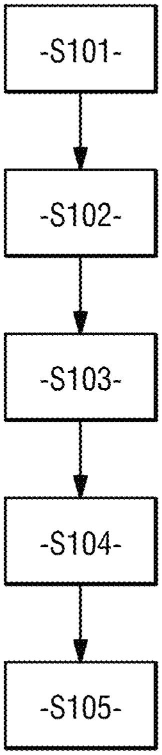
FIG. 6 is a flowchart of a method according to an embodiment of the invention.

A method for calculating the energy value $E_{out}$ is now described in relation to FIG. 6.

A step S101 consists in converting the analog signal $S_{in}$. The analog signal $S_{in}$ is converted into the request signal REQ and the direction signal DIR associated to the request signal REQ. The request signal REQ comprises at least one pulse comprising a rising edge, each pulse being representative of the analog signal $S_{in}$ crossing one of the plurality of predetermined levels, as described previously. The direction signal DIR is representative of the direction of the level crossing. Step S101 is advantageously performed by the CT-ADC 10.

Filtering the request signal REQ and direction signal DIR is then performed. More precisely, the filtering is a finite impulse response filtering operation and results in outputting the filtered output signal $F_{out}$. Filtering consists in two steps, a step S102 and a step S103.

Step S102 consists in delaying the request signal REQ and the associated direction signal DIR. Step S102 results in the output of at least one delayed request signal, and the at least one delayed direction signal associated to the at least one delayed request signal. The delayed request signal is delayed from the request signal REQ by the delay time, and the delayed direction signal is delayed from the direction signal DIR by the same delay time. Advantageously, and as shown in the figures, a plurality of delayed request signals, and a plurality of delayed direction signals associated to the delayed request signals are output, as well as the request signal DIR and direction signal REQ. Advantageously, step S102 is performed by the delaying module 12.

Step S103 consists in calculating the filtered output signal $F_{out}$ from the request signal REQ, the direction signal DIR, the delayed request signals and the delayed direction signals.

A step S104 of combining the request signal REQ and the at least one delayed request signal is then performed. The combination of the request signal REQ and the at least one delayed request signal results in the combined request signal CREQ. Step S104 is advantageously performed by the pulse combiner 16.

A step S105 of computing the stored energy value $A_{out}$ associated with each rising edge of the combined request signal CREQ using the filtered output signal $F_{out}$ is performed. The squared filtered output signal $SF_{out}$ is first output and the value of the stored energy value $A_{out}$ is computed from the squared filtered output signal $SF_{out}$. Step S105 is advantageously performed by the accumulator 33.

A step of outputting the energy value $E_{out}$ is performed when a falling edge occurs on the frame signal FR.

The device 1 performs low power energy calculation of the analog signal $S_{in}$, through continuous-time digital processing. The pulse combiner 16 of the device 1 allows to create a time base usable to output the energy value $E_{out}$, therefore making continuous-time digital processing compatible with energy calculations.

Advantageously, as previously mentioned, even though the rising edges comprised in the combined request signal CREQ are not distributed uniformly, a difference between the energy value $E_{out}$ output by the device 1 and an energy value output by a similar device using discrete time digital processing is low, with for example the discrepancy being of less than 1% on average in voice signal processing applications. This allows the energy value $E_{out}$ to be exploited in a similar way as the energy value which is obtained through discrete time digital processing. In an application using voice signal processing for keyword recognition by a convolutional neural network, using the device 1 resulted in 90.08% accuracy, and using a similar device performing discrete-time signal processing resulted in 90.21% accuracy. The number of digital processing modules 14, the order of the filtering unit 11 and the number of energy estimators 17 are advantageously chosen depending on an application desired by the user. For example, choosing eight digital processing modules 14, with filtering units 11 with an order of sixteen allows the user to process an audio analog signal $S_{in}$ corresponding to a voice signal.

The invention claimed is:

1. A device, for continuous-time energy calculation of an analog signal, comprising:

a continuous-time analog-to-digital converter, configured to convert the analog signal into a request signal, the request signal comprising at least one pulse, each pulse being representative of the analog signal crossing one of a plurality of predetermined levels, and a direction signal, associated to the request signal, the direction signal being representative of a direction of the level crossing;

at least one filtering unit, configured to perform a continuous-time finite impulse response filtering operation, the at least one filtering unit being configured to receive the request signal, the direction signal, and to output a filtered output signal, the at least one filtering unit comprising:

a delaying module, configured to receive the request signal and the direction signal, and to output at least one delayed request signal, delayed from the request signal by a delay time, and at least one delayed direction signal, delayed from the direction signal by the delay time, the at least one delayed request signal being associated with one of the at least one delayed direction signal; and a calculating module, connected to the delaying module the calculating module being configured to receive the request signal, the direction signal, the at least one delayed request signal and the at least one delayed direction signal and to calculate the filtered output signal;

wherein the device further comprises:

at least one pulse combiner, connected to the delaying module, the at least one pulse combiner being configured to receive the request signal and the at least one delayed request signal and to output a combined request signal; and at least one energy estimator, connected to the filtering unit and to the pulse combiner, the at least one energy estimator being configured to receive the filtered output signal and the combined request signal and configured to compute a stored energy value associated with each pulse of the combined request signal.

2. The device according to claim 1, wherein the combined request signal is a result of a concatenation of the request signal and the at least one delayed request signal.

3. The device according to claim 1, wherein the delaying module comprises a plurality of successive delay blocks, each delay block applying said delay time, a delayed request signal and a delayed direction signal being obtained as an output of each delay block.

4. The device according to claim 3, wherein the at least one calculating module comprises a plurality of multiply-accumulate blocks, each multiply-accumulate block receiving one of the plurality of delayed request signals and the delayed direction signal associated to the delayed request signal, or the request signal and direction signal.

5. The device according to claim 4, wherein each multiply-accumulate block is associated with a coefficient.

6. The device according to claim 4 wherein the at least one pulse combiner is configured to receive all or only some of the plurality of delayed request and associated direction signals.

7. The device according to claim 1, wherein the at least one energy estimator comprises:

a combinatory squarer configured to output a squared filtered output signal at each rising edge of the combined request signal;

an accumulator, configured to add the squared filtered output signal to a stored energy value to obtain an updated energy value and to set a value of the stored energy value to the updated energy value at each rising edge of the combined request signal, and wherein the accumulator is further configured to receive a frame signal, comprising alternating high states and low states, and when the frame signal goes from a high state to a low state, to output the stored energy value and then set the stored energy value to zero.

8. The device according to claim 7, comprising a plurality of energy estimators, each energy estimator being configured to receive a different frame signal.

9. The device according to claim 1, wherein the delaying module and/or the at least one calculating module and/or the at least one pulse combiner and/or the at least one energy estimator is implemented on an integrated circuit comprising at least one fully depleted silicon on insulator transistor.

10. A method for continuous-time energy calculation of an analog signal, the method being implemented by a device, wherein the device comprises:

a continuous-time analog-to-digital converter, configured to convert the analog signal into a request signal, the request signal comprising at least one pulse, each pulse being representative of the analog signal crossing one of a plurality of predetermined levels, and a direction signal, associated to the request signal, the direction signal being representative of a direction of the level crossing;

at least one filtering unit, configured to perform a continuous-time finite impulse response filtering operation, the at least one filtering unit being configured to receive the request signal, the direction signal, and to output a filtered output signal, the at least one filtering unit comprising:

a delaying module, configured to receive the request signal and the direction signal, and to output at least one delayed request signal, delayed from the request signal by a delay time, and at least one delayed direction signal, delayed from the direction signal by the delay time, the at least one delayed request signal being associated with one of the at least one delayed direction signal; and a calculating module, connected to the delaying module the calculating module being configured to receive the request signal, the direction signal, the at least one delayed request signal and the at least one delayed direction signal and to calculate the filtered output signal;

wherein the device further comprises:

at least one pulse combiner, connected to the delaying module, the at least one pulse combiner being configured to receive the request signal and the at least one delayed request signal and to output a combined request signal; and at least one energy estimator, connected to the filtering unit and to the pulse combiner, the at least one energy estimator being configured to receive the filtered output signal and the combined request signal and configured to compute a stored energy value associated with each pulse of the combined request signal, the method comprising:

converting the analog signal into the request signal, the request signal comprising at least one pulse, each pulse being representative of the analog signal crossing one of the plurality of predetermined levels, and into the direction signal, associated to the request signal, the direction signal being representative of the direction of the level crossing;

filtering the request signal and the direction signal by a finite impulse response filtering operation the filtering comprising:

delaying the request signal and the associated direction signal to output the at least one delayed request signal, delayed from the request signal by the delay time, and the delayed direction signal associated to the at least one delayed request signal, delayed from the direction signal by the delay time;

calculating from the request signal, the direction signal, the at least one delayed request signal and the at least one delayed direction signal the filtered output signal;

combining the request signal and the at least one delayed request signal into the combined request signal acting as a non-uniform time base; and computing the stored energy value associated with each pulse of the combined request signal from the filtered output signal.

* * * * *